(12) United States Patent
Religieux et al.

(10) Patent No.: US 10,883,185 B2
(45) Date of Patent: Jan. 5, 2021

(54) COPPER ELECTRODEPOSITION SOLUTION AND PROCESS FOR HIGH ASPECT RATIO PATTERNS

(71) Applicant: aveni, Massy (FR)

(72) Inventors: Laurianne Religieux, Paris (FR); Vincent Mevellec, Boulogne-Billancourt (FR); Mikailou Thiam, Compiegne (FR)

(73) Assignee: aveni, Massy (FR)

( * ) Notice: Subject to any disclaimer, the term of this patent is extended or adjusted under 35 U.S.C. 154(b) by 0 days.

(21) Appl. No.: 15/745,836

(22) PCT Filed: Dec. 26, 2017

(86) PCT No.: PCT/EP2017/084580
§ 371 (c)(1),
(2) Date: Jan. 18, 2018

(87) PCT Pub. No.: WO2018/122216
PCT Pub. Date: Jul. 5, 2018

(65) Prior Publication Data
US 2018/0363158 A1    Dec. 20, 2018

(30) Foreign Application Priority Data
Dec. 29, 2016 (FR) ...................... 16 63525

(51) Int. Cl.
C25D 3/38    (2006.01)
C25D 7/12    (2006.01)
H01L 21/768  (2006.01)

(52) U.S. Cl.
CPC ............... *C25D 3/38* (2013.01); *C25D 7/123* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 2004/0091625 A1 | 5/2004 | Winter et al. | |
| 2007/0062817 A1* | 3/2007 | Monchoix | C25D 3/38 205/291 |

(Continued)

FOREIGN PATENT DOCUMENTS

| | | |
|---|---|---|
| EP | 2975159 | 1/2016 |
| KR | 20150009400 | 1/2015 |

OTHER PUBLICATIONS

International Search Report issued in International Application No. PCT/EP2017/084580 dated Mar. 19, 2018 (9 pages).

(Continued)

*Primary Examiner* — Stefanie S Wittenberg
(74) *Attorney, Agent, or Firm* — Hamre. Schumann, Mueller & Larson, P.C.

(57) ABSTRACT

The present invention relates to an electrolyte composition for depositing copper on a conductive surface. The composition contains a combination of 2,2'-bipyridine, imidazole, tetra-ethyl-ammonium, and a complexing agent for copper. This electrolyte makes it possible to manufacture small size copper interconnects without any void and with a filling speed that is compatible with industrial constrain.

The invention also concerns a process for filling cavities with copper, and a semiconductor device that is obtained according to this process.

11 Claims, 2 Drawing Sheets

(56) References Cited

U.S. PATENT DOCUMENTS

2012/0160697 A1* 6/2012 Wu .................. C25D 5/10
205/205
2015/0159291 A1 6/2015 Religieux et al.
2015/0218724 A1 8/2015 Mevellec et al.

OTHER PUBLICATIONS

Piispanen et al.: "Complex Formation Equilibria of Some Aliphatic α-Hydroxycarboxylic Acids. 2. The Study of Copper (II) Complexes"; Acta Chemica Scandinavica, 1995, vol. 49, pp. 241-247.
Grabaric et al.: "Use of the Quinhydrone electrode for the determination of stability constants of copper (II) complexes by continuous potentiometric measurement"; Electrochimica Acta, 1975, vol. 20, No. 10, pp. 799-801.
Preliminary Search Report issued in French Application No. 1663525 dated Oct. 20, 2017 (2 pages).

* cited by examiner

COPPER ELECTRODEPOSITION SOLUTION AND PROCESS FOR HIGH ASPECT RATIO PATTERNS

The present invention relates to a copper electrodeposition solution that can be used to electroplate copper on metal surfaces. It also relates to a method for filling etched lines and holes in semiconductor substrates for fabricating interconnects in integrated circuits.

PRIOR ART

In recent years, 3D packages have been studied in order to come up with new copper plating processes that could effectively address both miniaturization and integration required for advanced and portable electronic products.

Miniaturization of devices such as high-power computer chips with high storage density and low dissipation also requires lower dimensions for interconnects such Through Silicone Vias. Technology semiconductor device fabrication nodes lower than 30 nm are consequently developed for chip manufacturing.

Interconnects form a network of electrically conducting copper metal for connecting various electrical devices within a dielectric material, typically silicon oxide. Fabricating interconnects involves etching trenches in a dielectric material layer, and etching blind vias used to connect two different dielectric material layer. The formed cavities are then filled with copper.

Therefore, there is a need to increase production rate without any detrimental defects, especially voids or seam lines in copper interconnects which tend to increase the resistance or even cause a break in the copper conducting lines.

It was found that known electrodeposition cannot be used at the industrial scale for filling trenches and vias having low opening dimensions or high depth dimensions. In particular, it has been observed that defects in the copper volume such as voids, may form in copper filling with conventional acidic copper ions baths.

During the interconnect manufacturing, copper plating technology is usually used to fill in the patterns with copper in order to form the conductive lines. Copper electroplating may also be performed when a very thin copper layer (called copper seed layers) is required on the carrier surface before the copper filling step. However, electrolytes that work for copper seed plating are not adapted for copper filling plating. For example solutions comprising bipyridine and pyridine that are known from document WO 2007/034116 were designed for making copper seed layers on substrates having high resistivity. However, aqueous copper (II) ions solutions described therein cannot be used to fill in trenches with copper, especially because copper plating speed is far too low.

Electrodeposition compositions known from WO 2007/096390 are directed to a copper fill technology of large trenches, having typically a 200 nm width. These electrolytes, that contains ethylenediamine and copper (II) ions only were found not to be adapted for filling trenches and vias having smaller opening sizes, and higher depth dimensions, because void lines (also called seams) appear in the copper deposit. This is also the case of copper (II) solutions that are disclosed in US 2015/0159291: a combination of two complexing compounds for copper (II) ions, namely 2,2'-bipyridine and imidazole, thiodiglycolic acid and tetramethyl ammonium sulfate at pH 6.2-6.7 cannot efficiently fill trenches and vias having low widths and high depths. The present inventors have found that voids are formed during copper plating on the patterns with high form factors using such a technology.

Further copper (II) ion solutions for both electroless and electrolytic plating comprising water, copper (II) ions, a complexing agent that is a hydroxy lower alkyl lower alkylene amine, diamine, triamine, polyamine, or imine, an organic nitrogen-containing compound such as 2,2'-bipyridine, an organic divalent sulfur-containing compound such as 2-mercaptothiazoline, and tetramethylammonium hydroxide have been also proposed in US 2004/0152303 for copper filling of trenches and vias. In this electrolytic composition, pyridine derivatives are used as stabilizer compounds in an electroless method and do not form copper (II) complexes. Instead, they form complexes with copper (I) ions that are generated in the solution, in a very low amount, during plating process. Such copper (I) ions diminish the plating rate, and do not dissociate to form a copper deposit on the copper seed layer that has been plated in a prior electroless step. These copper (II) solutions do not enable copper filling of recently proposed narrow trenches and vias, at a high speed and with no voids in the copper deposit; the inventors give evidenced for this disadvantage in the present description.

There is still a need for electrolytic plating solutions and electrodeposition methods for defect-free copper filling of interconnection structures having low widths and high depths, at satisfactory filling speeds that are compatible with industrial constraint.

The inventors have surprisingly found that combination of three copper (II) complexes, eventually in the presence of an accelerator, can reach this goal.

GENERAL DESCRIPTION OF THE INVENTION

Thus, according to one of its aspects, the present invention relates to an electrolyte for copper electrodeposition comprising, in an aqueous solution, cupric ions, at least two aromatic amines, and a complexing agent for cupric ions, wherein a complexing constant of a complex of cupric ions with the complexing agent is higher than a complexing constant a complex of cupric ions with at least one of the two aromatic amines.

According to a second aspect, the present invention relates to an electrochemical process for filling patterns hollowed-out in a dielectric substrate with copper, wherein the empty patterns have at least one surface, an opening dimension that is less than 45 nm and a form factor that is higher than 2, the process comprising the steps of:
bringing the surface into contact with an electrolyte as described above,
polarizing the surface to a cathodic electric potential allowing the electrodeposition of copper on the surface for a time sufficient to form a copper deposit that fills the entire volume of the empty patterns, advantageously without any void in the copper deposit.

It has been surprisingly found that the electrolyte and the process of the invention make it possible to fill in narrow trenches and small vias having small opening dimensions and large form factors with a copper deposit that has no material defects, at a satisfactory filling speed, and even at a higher filling speed in certain conditions.

Definitions

"Electrodeposition" means in the present text a method that makes it possible to cover a surface of a substrate with a metallic or organometallic coating, in which the substrate is polarized electrically and brought into contact with a liquid containing precursors of said metallic or organometallic coating (called electrolyte), so as to form said coating. Electrodeposition is performed for example by passing a current between the substrate to be coated constituting one electrode (cathode in the case of a metallic coating) and a second electrode (the anode) in a bath containing a source of precursors of the coating material (for example metal ions in the case of a metallic coating) and optionally various agents intended to improve the properties of the coating formed (evenness and fineness of the deposit, resistivity, etc.), optionally in the presence of a reference electrode. By international convention the current and voltage applied to the substrate of interest, i.e. to the cathode of the electrochemical circuit, are negative. Throughout this text, when these currents and voltages are mentioned with a positive value, it is implicit that this value represents the absolute value of said current or of said voltage.

"Electrolyte" means the liquid containing precursors of a metallic coating used in an electrodeposition process as defined above.

"Opening dimension" of patterns (1) such as vias or trenches, means the average diameter or average width of the patterns (1) hollowed-out beforehand in the dielectric substrate (2) and covered with a metal seed layer (4), wherein the average diameter is measured at the pattern opening (5). These dimensions are measured at the surface of the dielectric material, because the average diameter of the trenches at bottom thereof, or average diameter of blind vias at bottom thereof may be different from the opening (5) dimension especially in the case that the pattern walls are not perpendicular to the substrate surface.

"Continuous filling" means either a mass of void-free copper resulting from optimal filling of the entire empty volume of hollowed patterns (1) (also called cavity) that has been etched in a dielectric substrate (2). According to the invention, the optimal filling is obtained from the bottom (11) to the opening (5) of the patterns ("bottom-up"). In the prior art, holes or voids (8) may be observed in a copper deposit (6) between the sidewalls (10) of the patterns and the copper deposit (6) ("sidewall voids"). Voids equidistant from the side walls (10) of the patterns (1) in the form of holes or lines ("seams") may also be observed, generally because copper growth speed at the bottom (11) of the patterns can be slower than copper growth speed on the sidewalls (10) and at the opening (5) of the patterns. These voids may be quantified on transverse sections of the copper deposit (6) that are observed by transmission electron microscopy (TEM) with a magnification being between 100 000 and 150 000. The continuous copper deposit (6) of the invention preferably has an average volume percentage of voids below 10 vol. %, preferably less than or equal to 5 vol. %. The average percentage of voids is preferably 0 vol. %. The voids may be located in the copper deposit (6) itself. In some case, such a void forms in the upper zone of the cavity because copper growth speed is higher in the pattern opening (5) zone, than in the pattern bottom (11) zone. The term "between . . . and . . ." used in the present application, excludes the cut-off values, whereas the term "from . . . to . . ." includes the recited lower and upper limits.

DETAILED DESCRIPTION OF THE INVENTION

Among the several objects of this invention, therefore, is the provision of a process for electrolytic copper plating of vias and trenches, for the manufacture of integrated circuits, wherein said plating process reduces raw material costs, reduces waste disposal costs, decreases manufacturing duration, decreases capital investment costs, and decreases manufacturing costs compared to a conventional electrochemical process that needs a two-step plating process and two different plating electrolytes.

In a first embodiment, the invention describes an electrolyte having a pH being from 8.5 to 9.5, that is intended for electrodeposition of copper on a metal substrate, said electrolyte comprising, in an aqueous solution, from 0.4 to 50 mM of a mixture consisting of a first aromatic amine, a second aromatic amine and a complexing agent, from 0.4 to 50 mM of copper (II) ions, that can be in a complex form with the first aromatic amine, in a complex form with the second aromatic amine and/or in a complex form with a complexing molecule, wherein a complexing constant (constant K) of a complex consisting of copper(II) ions and the complexing molecule differ from a complexing constant of copper(II) complexes with a ligand selected in the group of the first aromatic amine, the second aromatic amine and mixtures thereof, by a factor being higher than 10, and preferably higher than 100.

Copper ions are preferably in complex form with the first aromatic amine, with the second aromatic amine and with the complexing agent.

In a second first embodiment, the present invention describes an electrolyte having a pH being from 8.5 to 9.5, that is intended for electrodeposition of copper on a metal substrate, said elecrolyte comprising, in an aqueous solution, from 0.4 to 50 mM of a mixture of at least two copper (II) ion complexes: at least one first complex of copper (II) ions with 2,2'-bipyridine and imidazole and at least one second complex of copper (II) ions with a complexing molecule, wherein the complex of copper(II) ions with the complexing molecule has a logarithmic complexing constant (log K), that is higher than 7.

The molar ratio between the first aromatic amine concentration and the second aromatic amine concentration can be from 1/2 to 2/1 and more preferably from 4/5 to 6/5, and the molar ratio between the first amine concentration and the complexing agent concentration can be from 1/4 to 4/1, for example from 1/3 to 3/1, or from 1/2 to 2/1±10%.

A complex of copper (II) ions can include the first aromatic amine alone, the second aromatic amine alone, or both aromatic amines. In the electrolyte solution, molar concentration of a complex of copper (II) ions including the first aromatic amine and the second aromatic amine is preferably higher than molar concentration of a copper complex including the first aromatic amine, and higher than molar concentration of a copper complex including the second aromatic amine. Still preferably the electrolyte contains no copper complex including the first aromatic amine alone and no copper complex including the second aromatic amine alone. In this particular embodiment, the first amine can be 2,2'-bipyridine, and the second amine can be imidazole.

In general, the electrodeposition composition according to the invention comprises a source of cupric ions $Cu^{2+}$ (copper (II) in the form of a salt). Advantageously, the source of copper (II) ions used for preparing the electrolyte is a copper (II) salt such as copper (II) sulfate, copper (II) chloride, copper (II) nitrate, copper (II) acetate, preferably copper (II) sulfate, and more preferably copper (II) sulfate pentahydrate.

According to a particular feature, copper (II) ions in a complex form is present in the electrodeposition composition at a concentration between 0.4 and 50 mM, preferably between 0.4 and 40 mM, for example between 1.0 and 25 mM, between 4.0 and 15 mM.

The electrolyte advantageously comprises a first complex of copper (II) ions comprising one 2,2'-bipyridine ligand and one imidazole ligand, and a second complex of copper (II) ions with the complexing agent for copper.

In the electrolyte, the molar ratio between the first complex of copper (II) and the second complex of copper (II) can be advantageously selected as a function of the complexing agent chemical formula, and of the pattern dimensions (such as opening dimension and depth). The molar ratio between the first complex of copper (II) and the second complex of copper (II) can be from 0.1 to 4.0, for example from 0.2 to 3.0, and preferably from 0.5 to 1.5.

The ratio between 2,2 bipyridine molar concentration and imidazole molar concentration is preferably from 1:2 to 2:1, more preferably from 4:5 to 6:5, and still more preferably from 0.95 to 1.05.

The ratio of molar concentration of complexing agent to molar concentration of copper (II) ions is preferably between 0.15 and 6.0, more preferably between 0.2 to 4.0 or from 0.3 and 2.5, for example from 0.5 to 2.0.

The present invention also describes an electrolyte having a pH being from 8.5 to 9.5, that is intended for electrodeposition of copper on a metal substrate, said electrolyte comprising, in an aqueous solution,
- from 0.4 to 50 mM, for example from 0.4 to 40 mM copper (II) ions, said copper(II) being preferably in a complex form,
- from 0.8 to 80 mM of a mixture consisting of 2,2'-bipyridine and imidazole that form complexes with copper (II) ions, the ratio between molar concentration of copper (II) ions and molar concentration of the mixture of imidazole and 2,2'-bipyridine being preferably from 1/5 to 10/1, for example from 1/4 to 5/1, from 1/3 to 3/1, from 1/2 to 2/1 or from 2/3 to 1/1,
- a complexing agent for copper (II) ions that forms, preferably within the electrolyte, a complex with copper (II) ions having a logarithmic complexing constant that is higher than 7 (log K),
- from 1 to 500 mg/l thiodiglycolic acid, and
- from 0.4 mM to 200 mM, for example from 0.4 mM to 120 mM or from 0.4 mM to 100 mM of tetra-ethyl-ammonium.

In a particular embodiment of this electrolyte, the ratio between molar concentration of copper (II) ions and molar concentration of the mixture of imidazole and 2,2'-bipyridine is from 1/4 to 2/1.

The features as described below apply to any of the previously described electrolyte, if appropriate.

The complexing agent for copper (II) that is part of the electrolyte of the invention or part of the process of the invention for preparing the electrolyte can be selected in the group consisting of citric acid, tartaric acid, ethylenediaminetetraacetic acid (EDTA), N-(hydroxyethyl)-ethylenediaminetriacetic acid (HEDTA), ethylenediamine, 1,6 diamino-cyclohexane, diethylene-triamine, triethylene-tetramine, N,N,N,N-tetramethyl-ethylene-diamine, N,N-Bis(2-hydroxyethyl)ethylenediamine, N,N,N,N-tetrakis(2-hydroxyethyl)ethylenediamine, glycine, 2-amino-ethylphosphonic acid, salicylic acid, salicylhydroxamic acid, catechol, 1,2-dihydroxybenzene-4-sulfonic acid, acetylacetone, acetylacetonate, dimethylglyoxime and 1,3-diaminopropane. The complexing agent can be in at least one of his acidic or basic forms when complexed with copper.

In a particular embodiment, the complexing agent is ethylenediamine.

In another particular embodiment, the complexing agent is tartrate ion.

The electrolyte of the invention may advantageously be devoid of polymeric suppressors such as polyethylene glycols. In the prior art, a source of chlorine ions is generally added to the electrolyte to act in synergy with a polymeric suppressor. In the context of the present invention, it was discovered that it is not necessary to add chlorine ions to guarantee the efficacy of the solution. Moreover, the electrolyte of the invention comprises less than 50 ppm of chlorine ions. The electrolyte of the invention is preferably free from chlorine ions.

Surfactants are generally required in the prior art for improving the wettability of the surface of a barrier material to be coated with copper. According to the invention, it is not necessary to incorporate surfactants in the electrolyte.

The electrolyte may comprise a leveler, an accelerator and/or a brightener known from the prior art.

The pH of the electrolyte is preferably selected to be above 8.5. This is all the more surprising as the electrolytes of the prior art used for filling cavities generally have a far lower pH to guarantee sufficient conductivity of the solution owing to the presence of $H^+$ ions, and in consequence, to obtain adequate kinetics. The pH of the electrolyte of the invention is preferably between 9.0 and 9.5, and even more preferably 9.2±10%.

According to a particular embodiment, the concentration of the copper (II) ions is between 0.4 and 50 mM, for example between 0.4 and 40 mM, the concentration of 2,2'-bipyridine is between 0.4 and 40 mM, and the concentration of complexing agent is between 1 to 100 mM.

In the case that the complexing agent is ethylenedia mine, the concentration of copper (II) ions can be between 4 and 20 mM, the concentration of the mixture consisting of 2,2'-bipyridine and imidazole can be between 5 and 20 mM and the concentration of complexing agent can be between 1 and 60 mM.

In the case that the complexing agent is tartrate ion, the molar concentration of copper (II) ions can be from 4 to 20 mM, the molar concentration of 2,2'-bipyridine and imidazole mixture can be from 5 to 20 mM and the molar concentration of complexing agent for copper (II) ions can be from 3 to 50 mM.

In the electrolyte, the first aromatic amine concentration (such as 2,2'-bipyridine concentration) preferably represents from 0.05 to 1 molar equivalent, more preferably from 0.1 to 0.8 molar equivalent, more preferably from 0.4 to 0.7 molar equivalent of the concentration of copper (II) ions.

In the electrolyte, the second aromatic amine concentration (such as imidazole concentration) preferably represents from 0.05 to 1 molar equivalent, more preferably from 0.1 to 0.8 molar equivalent, more preferably from 0.4 to 0.7 molar equivalent of the concentration of copper (II) ions.

The present invention also concerns a process for preparing one of the electrolytes as described above.

Such a process may comprise a step of preparing a first solution of a copper(II) complex with 2,2'-bipyridine and imidazole, a step of preparing a second solution of a copper (II) complex with a complexing agent for copper (II) ions that forms a complex with copper (II) ions having a logarithmic complexing constant (log K) that is higher than 7, a step of mixing the first solution and the second solution in a particular volume ratio, and a step of obtaining the electrolyte comprising at least two complexes: a complex of copper (II) with 2,2'-bipyridine and imidazole, and a complex of copper(II) with the complexing agent.

Another process may comprise a step of preparing a first solution comprising copper (H) ions, the first aromatic amine, and the second aromatic amine, so as to advantageously prepare a complex of copper (II) ions with the first aromatic amine and the second aromatic amine, a step of preparing a second solution comprising copper (II) ions and the complexing molecule, so as to advantageously prepare a complex of copper (H) ions with the complexing molecule, and a step of mixing the first and the second solution.

In the first solution molar concentration of copper (II) ions is preferably between 0.3 to and 60 mM or from 0.8 to 50 mM, preferably between 1 and 10 mM, more preferably between 3 and 9 mM.

In the first solution, the first aromatic amine concentration (such as 2,2'-bipyridine concentration) and the copper (II) molar concentration are preferably equal to the second aromatic amine concentration (such as imidazole concentration) within a ±10% possible variation range.

The pH of the first solution may optionally be adjusted with a base or an acid known by a person skilled in the art after mixing the aromatic amines with the copper (II) ions. A pH adjuster can be sulfuric acid or tetra-ethyl-ammonium hydroxide.

The first solution may have a pH value between 8 and 10, for example from 8.85 to 9.25.

The pH of the first solution, once adjusted, may optionally be stabilized in the aforementioned pH range by means of a buffer known from one skilled in the art.

In the second solution, molar concentration of copper (II) ions is preferably between 30 to and 100 mM or from 40 to 80 mM, preferably between 60 and 70 mM.

In the second solution, the complexing agent concentration is generally chosen with relation to the copper (II) concentration in the electrolyte, in order to form a significant amount of a complex of copper with the complexing agent. The complexing agent concentration preferably represents from 0.5 to 3 molar equivalent of the concentration of copper (II) ions.

In the case that the complexing agent is tartrate, the complexing agent concentration preferably represents from 0.5 to 2 molar equivalent, more preferably from 0.65 to 1.25 molar equivalents, more preferably from 0.75 to 1.15 molar equivalent, and still more equivalent 0.95 to 1.05 molar equivalent of the concentration of copper (II) ions. The pH of the second solution may optionally be adjusted with a base or an acid known by a person skilled in the art after mixing the aromatic amines with the copper (II) ions.

The second solution may comprise a pH adjuster in order to have a pH value between 7 and 11. The pH is preferably adjusted in order to form a complex of copper ions with the complexing agent.

The pH of the second solution, once adjusted, may optionally be stabilized in the aforementioned pH range by means of a buffer known from one skilled in the art.

The volume ratio between the second solution and the first solution can be from 5 vol. % to 35 vol. %.

Additional ingredients can be incorporated into the first solution and/or into the second solution before mixing the two.

Alternatively, additional ingredients can be added in a further step following the step of mixing the first solution and the second solution.

Although there is in principle no restriction about the solvent (provided that it sufficiently solubilizes the active species of the solution and does not interfere with electrodeposition), water will be preferred as a solvent for the electrolyte, for the first solution and for the second solution. According to one embodiment, the solvent essentially comprises water, i.e. comprises more than 90 vol. %.

The first solution and the second solution can be prepared by dissolution in a solvent of a salt or hydrate thereof that is selected from the group consisting of copper (II) sulfate, copper (II) chloride, copper (II) nitrate, copper (II) acetate, preferably copper (II) sulfate, and more preferably copper (II) sulfate pentahydrate.

The invention also relates to an electrochemical process for filling patterns that have been hollowed-out in a dielectric substrate (2), the patterns having a (5) dimension less than 45 nm, preferably less than 25 nm, and a form factor higher than 2:1, preferably higher than 3:1.

In a particular embodiment, the patterns have an opening (5) dimension less than 25 nm, and a form factor higher than 3:1.

The process may be an electrochemical process for copper filling of patterns (1) that are hollowed-out in a dielectric substrate (2), and have at least one exposed surface (3) of a metal seed layer (4), wherein said patterns (1) have an opening (5) dimension that is less than 45 nm and a form factor that is higher than 2, said process comprising the steps of:
  bringing the exposed surface (3) into contact with one of the electrolytes as described above, and
  polarizing the exposed surface (3) with a cathodic electric current and allowing the electrodeposition of copper onto the exposed surface (3), for a time sufficient to completely fill patterns (1) with a copper deposit (6) that comprises no void.

All the features that have been described in relation to the electrolytes and a process for preparing the electrolytes of the invention apply to the electrodeposition process.

The electrolyte is used by applying an electric current. It is not indicated in an electroless process, and for this reason does not contain a reducing agent of copper (II) oxide, such as dimethylamine borane or hypophosphorous acid.

The electrochemical process of the invention has the advantage of providing a copper filling speed that is at least twice or at least three times higher than a copper filing speed that is obtained with a electrochemical process that is identical with the exception that the electrolyte comprises no complex of copper (H) ions with the complexing agent as described above.

In this embodiment, the patterns (1) have preferably an opening (5) dimension lower than 25 nm and a form factor that is higher than 3.

The copper filling speed depends on the time that is necessary to fill in the entire volume of the trenches or vias. Copper filling rate if the volume percentage of the pattern cavity that is filled with copper at the end of a predetermined time, for example 1 min or 3 min. Copper filling speed can be expressed as the time that is necessary to fill the entire volume of a predetermined pattern cavity.

The invention also describes a semiconductor manufacturing process that is analogous to a copper damascene system or a copper dual damascene system.

Figure 1:
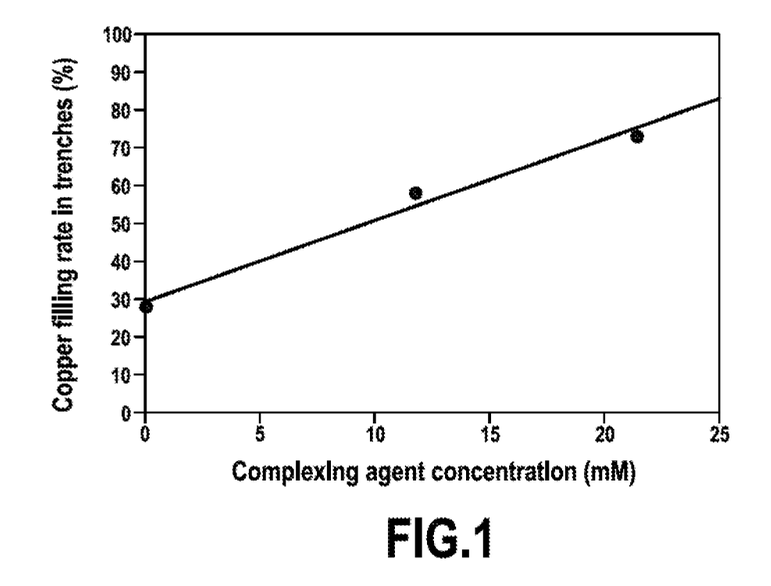
FIG. 1 is a graphic representing the copper filling rate in trenches (% in volume) as a function of complexing agent concentration in the electrolyte (mM).
Figure 2:
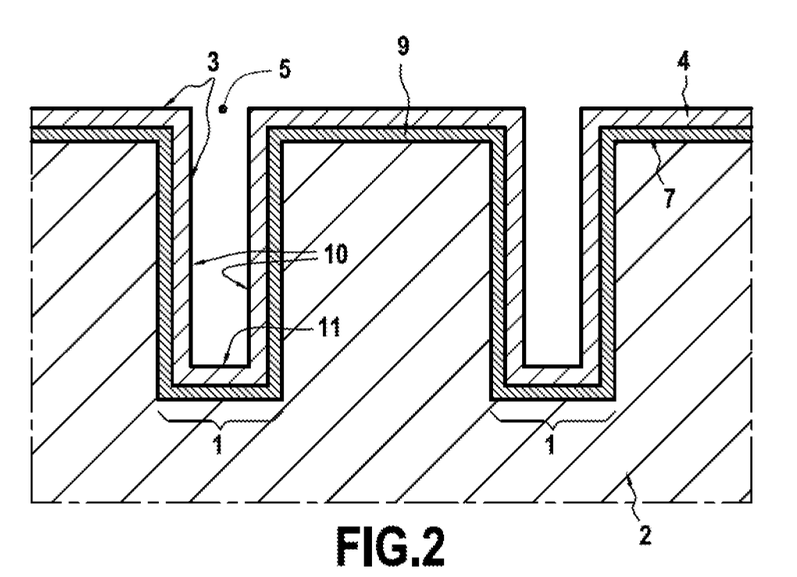
FIG. 2 shows patterns (1) that have been first etched in a dielectric substrate (2), coated with a diffusion barrier layer (7) and further coated with a metal seed layer (4).

A main first step comprises etching a dielectric substrate (2). The architecture is comprised of a combination of the aforementioned patterns (1) that can be trenches and vias. Next, a diffusion barrier layer (7) is laid over a free surface of the dielectric substrate (2) comprising the etched patterns (1), in order to prevent diffusion of the subsequently applied copper layer into the substrate's junctions.

The electrochemical deposition process of the invention may comprise a step of forming a thin metal seed layer (4) made of copper (Cu), cobalt (Co) or ruthenium (Ru), prior to copper filing step. The metal seed layer may comprise at least two materials selected in the group consisting of copper (Cu), cobalt (Co) or ruthenium (Ru). In a particular embodiment, the metal seed layer comprises a ruthenium layer and a copper layer. In another embodiment, the metal seed layer comprises a cobalt layer and a copper layer, the cobalt layer being layered on a diffusion barrier layer.

This thin metal seed layer (4) can be deposited onto a diffusion barrier layer (7) using a technique known from one skilled in the art, such as chemical vapor deposition (CVD), physical vapor deposition (PVD), atomic layer deposition (ALD), electroless or electrochemical deposition.

Consequently, the process of the invention may comprise a step of forming the metal seed layer (4) using chemical vapor deposition (CVD), physical vapor deposition (PVD), atomic layer deposition (ALD), electroless deposition or electrochemical deposition, on the condition that electroless deposition and electrolytic deposition both use an electrolyte that is different from the as described with regard to the first embodiment of the invention.

According to a particular embodiment of the invention, the metal seed layer (4) is formed via PVD route.

The metal seed layer (4) has preferably a thickness being between 0.5 and 20 nm, preferably between 1 to 10 nm, for example between 2 and 5 nm. Such thickness values are preferably measured on the inside walls of the patterns. Indeed, the metal seed layer (4) may have a different thickness value on the dielectric substrate field (9); at the pattern opening (5), and on the pattern sidewalls (10) and on the pattern bottom (11).

The diffusion barrier layer (7) may comprise at least one material selected from the group consisting of tantalum (Ta), titanium (Ti), tantalum nitride (TaN), titanium nitride (TiN), manganese (Mn) and tungsten (W). The thickness of the diffusion barrier layer is generally between 0.5 and 20 nm. This layer can be deposited using a technique known from one skilled in the art, such as chemical vapor deposition (CVD), physical vapor deposition (PVD) or atomic layer deposition (ALD). The diffusion barrier layer can be formed of two layers each of the layers being composed of one of the material as disclosed above.

According to an embodiment of the invention, the dielectric substrate (2) is covered successively on the pattern sidewalls (10), on the pattern bottom (11) and on the dielectric substrate field (9) with at least two layers of two different materials forming a copper diffusion barrier as disclosed here above, and a conductive layer as describes above.

The method of the invention makes it possible to deposit copper in patterns (1) with small opening (5) dimension, notably trenches of very small width. Thus, the opening (5) dimension of the patterns (1) may be below an upper limit corresponding to a technology node selected from the group consisting of 45 nm, 40 nm, 35 nm, 30 nm, 25 nm, 20 nm, 15 nm and 10 nm. The opening (5) dimension of the patterns (1) may be selected in the group consisting of 45 nm, 32 nm, 22 nm, 14 nm, 10 nm, 7 nm and 5 nm. The patterns (1) preferably have an opening (5) dimension greater than or equal to 5 nm.

The form factor—expressed as the ratio between depth and opening (5) dimension of the patterns (1)—may vary from 2:1 to 20:1, for example from 3:1 to 10:1. The method according to the invention advantageously allows the void free deposition of copper in cavities having particularly high form factors, for example greater than 2:1, greater than 3:1, greater than 4:1, greater than 5:1, greater than 6:1, or even greater than 7:1 and above, preferably below 20:1 or below 15:1.

According to a particular embodiment, the patterns have an opening (5) dimension being from 5 to 45 nm and a form factor being from 3:1 to 10:1.

The patterned surface of the conductive material comprises three main zones: the field (9) that is shared by all the cavities of patterns (1), each cavity comprising sidewalls (10) and a bottom (11).

During the deposition step, the surface of the cavity to be filled may be polarized, either in constant-current mode (fixed imposed current), or in constant-voltage mode (potential imposed and fixed, optionally relative to a reference electrode), or else in pulsed mode (in current or in voltage).

According to one embodiment of the invention, polarization of the surface of the cavity of the pattern is carried out in continuous mode, imposing a current per unit area in a range from 0.1 mA/cm$^2$ to 50 mA/cm$^2$, preferably from 0.5 mA/cm$^2$ to 5 mA/cm$^2$, and preferably between from 0.5 to 1.5 mA/cm$^2$.

According to one embodiment of the invention, polarization of the surface of the cavity of the pattern is carried out in current-pulsed or voltage-pulsed mode at medium or high frequency.

According to another embodiment of the invention, the pattern free surface is polarized in an alternating mode with a pulsed cathode current and with a pulsed anode current (pulse reverse).

According to a further embodiment of the invention, the pattern free surface is polarized in an medium or high frequency alternating mode with a pulsed cathode potential and with a pulsed anode potential.

The polarization of the surface may be carried out for example in current-pulsed mode by imposing an alternation of periods of polarization and periods of rest without polarization. The frequency of the periods of polarization may be between 0.1 Hz and 4 kHz (i.e. a duration of polarization between 0.02 ms and 400 ms), preferably between 1 Hz and 600 Hz, for example between 3 Hz and 333 Hz, whereas the frequency of the periods of rest may be between 0.1 Hz and 4 kHz, preferably between 1 Hz and 600 Hz, for example 3 Hz. The surface may be polarized by applying a current with maximum intensity between 0.01 and 10 mA/cm$^2$, for example about 0.4 to 5 mA/cm$^2$.

According to a particular embodiment, cathodic electric current alternates a first intensity being from 0.33 mA/cm$^2$ to 1.67 mA/cm² at a frequency being between 1 Hz and 4 kHz, and a second intensity being equal to 0 mA/cm² at a frequency being between 0.5 Hz and 5 kHz.

The time for filling the patterns (1) smaller than 40 nm is advantageously between 10 s and 10 minutes depending on the size of the patterns, preferably between 15 s and 5 minutes. In one embodiment, the duration of the electrodeposition step is under 2 minutes to obtain complete filling of trenches with an opening (5) dimension under 25 nm and depth greater than 75 nm.

The electrolytes according to the invention may be used following a procedure comprising an initial step of "hot entry", but particularly advantageously, they may also be used following a procedure comprising an initial step of "cold entry", during which the surface to be coated is brought into contact with the electrodeposition bath without electrical polarization, and maintained in this state for the desired time. Thus, according to a particular feature, the method according to the invention comprises, prior to electrodeposition, a step of "cold entry" during which the surface of the cavity to be filled is brought into contact with the electrodeposition composition according to the invention without electrical polarization, and optionally maintained in this state for at least 30 seconds.

The electrodeposition process according to the invention may be carried out at a temperature between 20 and 35° C., i.e. at room temperature. Therefore it is not necessary to heat the electrodeposition bath.

The method according to the invention allowed filling with copper to be performed with excellent quality, without material defects.

The invention finally relates to the semiconductor devices obtainable by the method that has just been described.

The invention is illustrated in more detail with the following figures and examples.

EXAMPLE 1

Trenches coupled with vias of interconnections were filled with electrodeposited copper onto a PVD copper seed layer. Deposition was performed using a composition containing copper (II) sulphate, 2,2'-bipyridine, imidazole, ethylene diamine, and having pH 9.2.

A. Material and Equipment

Substrate:

The substrate used in this example consisted of a piece of silicon with a length of 4 cm and a width of 4 cm, covered with a structured low-k dielectric layer having trenches and itself coated with a 3 nm-thick layer of PVD tantalum nitride and a 3 nm-thick CVD cobalt liner. Liner was covered, at least partially, by a thin PVD copper seed layer inferior to 10 nm on the field.

This layer of tantalum nitride constitutes a diffusion barrier to copper such as it is used in so-called "damascene" structures in the fabrication of copper interconnects of integrated circuits. The trenches are produced by a method called "multiple patterning".

The substrate has trenches of 20 nm width and 150 nm depth, coupled with vias of interconnections of 20 nm diameter and 220 nm depth (see FIG. 2).

Electrodeposition Solution:

A first solution comprising 2,2'-bipyridine, imidazole and $CuSO_4(H_2O)_5$ in equal molar concentrations was prepared.

A second solution comprising ethylenediamine and $CuSO_4(H_2O)_5$, ethylenediamine molar concentration being twice copper molar concentration was prepared.

The first and the second solution were mixed in a selected ratio, thiodiglycolique acid was added, and pH was adjusted so as to obtain the electrolyte solution.

In this solution, the concentration of 2,2'-bipyridine was 5.93 mM, the concentration of imidazole was 5.93 mM and the concentration of ethylene diamine was 24 mM. The concentration of $CuSO_4(H_2O)_5$ was equivalent to 7.18 mM. The concentration of thiodiglycolic add could vary from 5 to 200 ppm, for example could be equal to 25 ppm. Tetraethyl ammonium hydroxide was in a concentration of 5.27 mM. pH of the solution was equal to 9.2.

Equipment:

In this example, electrolytic deposition equipment was used, made up of two parts: the cell intended to contain the electrodeposition solution, equipped with a system for recirculation of fluid for controlling the hydrodynamics of the system, and a rotating electrode equipped with a sample holder suitable for the size of the pieces used (4 cm×4 cm). The electrolytic deposition cell had two electrodes:

a copper anode the piece of structured silicon coated with the stacking of TaN, Co and Cu.

Connectors provided electrical contact of the electrodes, which were connected by electrical leads to a potentiostat supplying up to 20 V or 2 A.

B. Experimental Protocol

The cathode was polarized in current-pulsed mode in a range of current from 3 mA (or 033 mA/cm²) to 15 mA (or 1.67 mA/cm²), for example 5 mA (or 0.55 mA/cm²) with a pulse frequency between 1 and 10 kHz in cathodic polarization, and between 0.5 and 5 kHz in zero polarization between two cathodic pulses.

C. Results Obtained

The duration of the electrodeposition step was 1 minute to obtain complete filling of the 20 nm-wide and 150 nm-deep trenches and 20 nm diameter and 220 nm depth vias, that are covered on their overall surface with a copper seed layer having a thickness of 10 nm.

Figure 3:
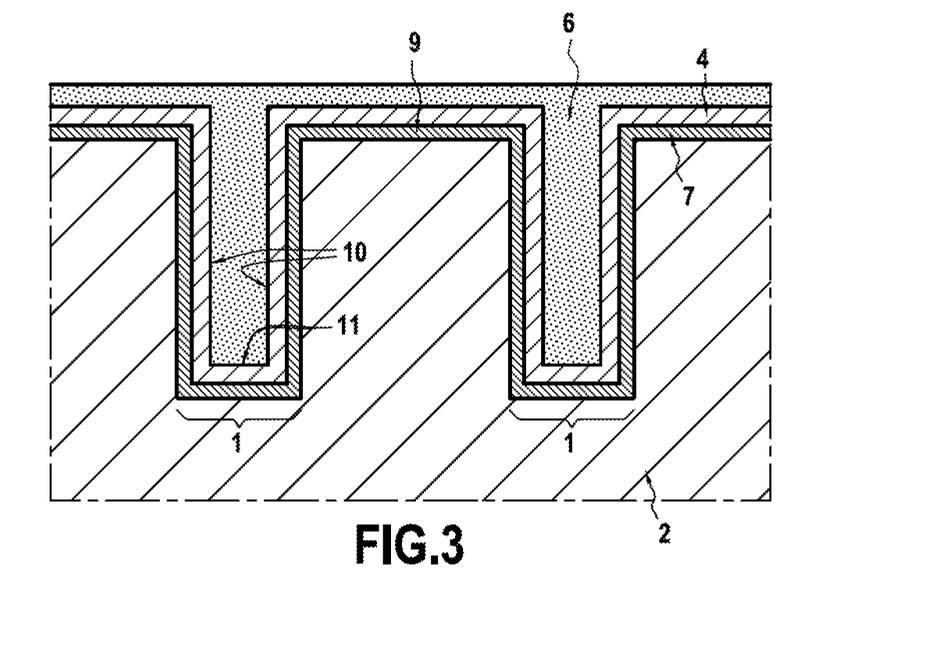
FIG. 3 shows patterns (1) as disclosed in FIG. 2 that have been filled with a copper deposit (6) according to the process of the invention. No void is observed in the copper deposit (6).
Figure 4:
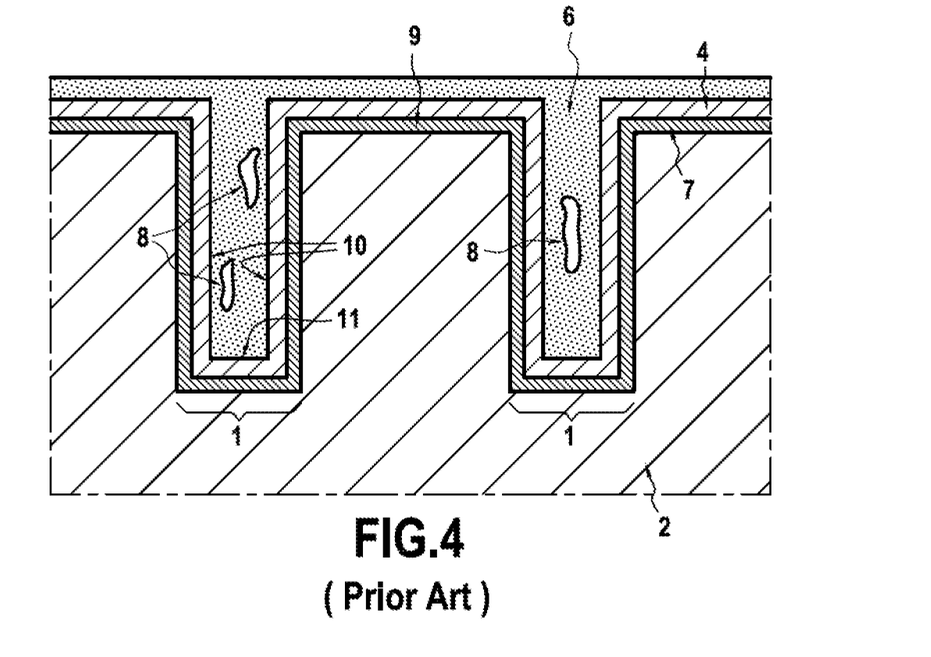
FIG. 4 shows patterns (1) as disclosed in FIG. 2 that have been filled with copper according to a prior art. Void lines and holes (8) are observed in the copper deposit (6).

TEM transverse sections (with magnification being 130 000) revealed void-free copper filling into the trenches and vias of interconnexion (see FIG. 3). Addition of ethylene diamine enhances bottom-up efficiency from the bottom of the structures that is combined with a high suppression effect.

The duration of the electrodeposition step was 1 minute to obtain complete void free filling of the 20 nm-wide and 150 nm-deep trenches and 20 nm diameter and 220 nm depth vias.

The duration of the electrodeposition step was 3 minutes to obtain complete filling of the 20 nm-wide and 150 nm-deep trenches and 20 nm diameter and 220 nm depth vias, with a electrolyte having the same composition with the exception that it contains no complexing agent (see comparative example 3).

Bottom-up rate (also called copper filling speed and expressed as the time necessary to completely fill the cavities of the patterns) is 3 times higher in comparison to prior art electrodeposition solutions containing no ethylene diamine. Plating time drastically diminishes, and no void is observed.

EXAMPLE 2 COMPARATIVE

Deposition was performed in the same conditions as in Example 1 with the exception that a composition containing copper (II) sulphate, 2,2'-bipyridine, imidazole, no ethylene diamine complexing agent, and having pH 6.5 was used instead.

Electrodeposition Solution:

Copper (II) sulphate, 2,2'-bipyridine and imidazole were dissolved in water so as to obtain a solution. In this solution, the concentration of 2,2'-bipyridine was 4.55 mM and the concentration of imidazole was 4.55 mM. The concentration of $CuSO_4(H_2O)_5$ was equal to 1.13 g/l, which is equivalent to 4.55 mM. The concentration of thiodiglycolic add could vary from 5 to 200 ppm, for example could be equal to 10 ppm. Tetramethyl ammonium sulfate was in a concentration of 14 mM. pH of the solution was equal to 6.2-6.7.

Results Obtained

The duration of the electrodeposition step was 3 minutes to obtain complete filling of the 20 nm-wide and 150 nm-deep trenches and 20 nm diameter and 220 nm depth vias.

EXAMPLE 3 COMPARATIVE

Deposition was performed in the same conditions as in Example 1 with the exception that a composition containing copper (II) sulphate, 2,2'-bipyridine, imidazole, no ethylene diamine, and having a pH 9.2, was used instead.

Electrodeposition Solution:

In this solution, the concentration of 2,2'-bipyridine was 6.05 mM and the concentration of imidazole was 6.05 mM. The concentration of $CuSO_4(H_2O)_5$ was equal to 1.5 g/l, which is equivalent to 6.05 mM. The concentration of thiodiglycolic acid could vary from 5 to 200 ppm, for example could be equal to 25 ppm. Tetraethyl ammonium hydroxide was also added to the composition in a concentration of 5.38 mM. pH of the solution was equal to 9.2.

Results Obtained

The duration of the electrodeposition step was 3 minutes to obtain complete void free filling of the 20 nm-wide and 150 nm-deep trenches and 20 nm diameter and 220 nm depth vias.

TEM transverse sections revealed conformal copper filling into the trenches and vias of interconnexion and formation of "seam" voids.

EXAMPLE 4

Trenches coupled with interconnection's vias were filled with copper directly on a PVD prepared copper seed layer. The deposit was realized while using a solution containing copper (II) sulfate, 2,2'-bipyridine, imidazole, and ethylenediamine at pH 9.2.

A. Material and Equipment

Substrate:

The substrate used in this example consisted of a piece of silicon with a length of 4 cm and a width of 4 cm, covered with a structured low-k layer having trenches 20 nm wide and 150 nm deep and vias with 20 nm opening diameter and 220 nm of height (See FIG. 2) The structure is itself coated with a layer of tantalum nitride of 3 nm thick deposited by PVD and a layer of cobalt of 3 nm thick deposited by CVD. A copper seed layer, at least partially, is finally deposited by PVD with less than 10 nm thickness.

The layer of tantalum nitride constitutes a diffusion barrier to copper such as is used in so-called "damascene" structures in the fabrication of copper interconnects of integrated circuits. The trenches are produced by a method called "double patterning".

Electrodeposition Solution:

A first solution comprising 2,2'-bipyridine, imidazole and $CuSO_4(H_2O)_5$ in equal molar concentrations was prepared.

A second solution comprising ethylenediamine and $CuSO_4(H_2O)_5$, ethylenediamine molar concentration being twice copper molar concentration was prepared.

The first and the second solution were mixed in a selected ratio, thioglycolique acid was added, and pH was adjusted so as to obtain the electrolyte solution.

In this solution, the concentration of 2,2'-bipyridine was 4.84 mM and the concentration of imidazole was 4.84 mM. The concentration of $CuSO_4(H_2O)_5$ was equal to 17.05 mM and the concentration of ethylenediamine was 25.04 mM. The concentration of thiodiglycolic add could vary from 5 to 200 ppm, for example could be equal to 25 ppm. The pH of the solution was adjusted with tetraethylammonium hydroxide and was to 9.2.

Equipment:

In this example, electrolytic deposition equipment was used, made up of two parts: the cell intended to contain the electrodeposition solution, equipped with a system for recirculation of fluid for controlling the hydrodynamics of the system, and a rotating electrode equipped with a sample holder suitable for the size of the pieces used (4 cm×4 cm). The electrolytic deposition cell had two electrodes:

a copper anode the piece of structured silicon coated with the layers of tantalum nitride, cobalt and copper seed respectively, which constitutes the cathode.

Connectors provided electrical contact of the electrodes, which were connected by electrical leads to a potentiostat supplying up to 20 V or 2 A.

B. Experimental Protocol

The cathode was polarized in current-pulsed mode in a range of current from 3 mA (or 033 mA/cm2) to 15 mA (or 1.67 mA/cm2), for example 5 mA (or 0.71 mA/cm2) with a pulse frequency between 1 and 10 kHz in cathodic polarization, and between 0.5 and 5 kHz in zero polarization between two cathodic pulses.

C. Results Obtained

The electrodeposition duration was around 1 minute to obtain an entire filling of the trenches 20 nm wide and 150 nm deep and the vias with 20 nm opening diameter and 220 nm of height. A close inspection with TEM analysis of the cross sections with a 130.000 magnification reveals a perfect filling without side wall voids or central voids. Ethylenediamine allows a three times more rapid fill of this type of structure, compared to a solution without the ethylenediamine copper complex. A little drawback in the process is the production of small protrusions on the copper overburden depending on the type of tool used.

EXAMPLE 5

Trenches were filled with copper directly on a PVD prepared copper seed layer. The deposit was realized while using a solution containing copper (II) sulfate, 2,2'-bipyridine, imidazole, tartrate and having pH 9.2.

A. Material and Equipment

Substrate:

The substrate used in this example consisted of a piece of silicon with a length of 4 cm and a width of 4 cm, covered with a structured low-k layer having trenches 21 nm wide and 152 nm deep. The structure is itself coated with a layer of tantalum nitride of 3 nm thick deposited by PVD and a layer of cobalt of 3 nm thick deposited by CVD. A copper seed layer, at least partially, is finally deposited by PVD with less than 10 nm thickness.

The layer of tantalum nitride constitutes a diffusion barrier to copper such as is used in so-called "damascene" structures in the fabrication of copper interconnects of integrated circuits. The trenches are produced by a method called "double patterning".

Electrodeposition Solution:

A first solution comprising 6.05 mM 2,2'-bipyridine, 6.05 mM imidazole and 6.05 mM $CuSO_4(H_2O)_5$ was prepared.

A second solution comprising 65.4 mM tartaric acid and 64.1 mM $CuSO_4(H_2O)_5$ was prepared.

The first and the second solution were mixed in a selected ratio, thioglycolique acid was added, and pH was adjusted so as to obtain the electrolyte solution.

In this solution, the concentration of 2,2'-bipyridine was 5.44 mM and the concentration of imidazole was 5.44 mM. The concentration of CuSO4(H2O)5 was equal to 11.85 mM and the concentration of tartrate was 6.54 mM. The concentration of thiodiglycolic acid could vary from 5 to 200 ppm, for example could be equal to 25 ppm. The pH of the solution was adjusted with tetraethylammonium hydroxide and equal to 9.2

Equipment:

The equipment is strictly identical to the one presented in example 4.

B. Experimental Protocol

The cathode was polarized in current-pulsed mode in a range of current from 3 mA (or 0.33 rnA/cm2) to 15 mA (or 1.67 mA/cm2), for example 4.5 mA (or 0.64 mA/cm2) with a pulse frequency between 1 and 10 kHz in cathodic polarization, and between 0.5 and 5 kHz in zero polarization between two cathodic pulses.

C. Results Obtained

The electrodeposition duration was around 3 minutes to obtain an entire filling of the trenches 21 nm wide and 152 nm deep. A close inspection with TEM analysis of the cross sections with a 130.000 magnification reveals a perfect filling without side wall voids or central voids. Tartrate allows a rapid fill of this type of structure but avoids this time small protrusions on the final copper overburden.

EXAMPLE 6

Trenches with only the cobalt liner were filled. The deposit was realized while using a solution containing copper (II) sulfate, 2,2'-bipyridine, imidazole, tartrate, and having pH 9.2.

A. Material and Equipment

Substrate:

The substrate used in this example consisted of a piece of silicon with a length of 4 cm and a width of 4 cm, covered with a structured low-k layer having trenches 21 nm wide and 152 nm deep. The structure is itself coated with a layer of tantalum nitride of 3 nm thick deposited by PVD and a layer of cobalt of 3 nm thick deposited by CVD. The latter layer representing the liner.

Electrodeposition Solution:

The solution used here is exactly the same as the one described in example 5.

Equipment:

The equipment is strictly identical to the one presented in example 4.

B. Experimental Protocol

The electrical cathodic pulse used here is identical to the one presented in the example 5.

C. Results Obtained

The electrodeposition duration was around 5 minutes to obtain an entire filling of the trenches 21 nm wide and 152 nm deep. A close inspection with TEM analysis of the cross sections with a 130.000 magnification reveals a perfect filling without side wall voids or central voids. Addition of the tartrate copper complex allows a direct fill on cobalt liner with a quite rapid fill. No small protrusions on the final copper overburden were detected.

EXAMPLE 7 COMPARATIVE

Trenches with only the cobalt liner as in example 6 were filled. The deposit was realized while using a solution containing copper (II) sulfate, 2,2'-bipyridine, imidazole, in absence of another ligand, pH being 9.2.

A. Material and Equipment

Substrate:

The substrate used in this example is identical to the one in example 6.

Electrodeposition Solution:

In this solution, the concentration of 2,2'-bipyridine was 6.05 mM and the concentration of imidazole was 6.05 mM. The concentration of $CuSO_4(H_2O)_5$ was equal to 6.05 mM. The concentration of thiodiglycolic acid could vary from 5 to 200 ppm, for example could be equal to 25 ppm. The pH of the solution was adjusted with tetraethylammonium hydroxide and equal to 9.2

Equipment:

The equipment is strictly identical to the one presented in example 4.

B. Experimental Protocol

The electrical cathodic pulse used here is identical to the one presented in the example 5.

C. Results Obtained

The electrodeposition duration was around 5 minutes to obtain an entire filling of the trenches 21 nm wide and 152 nm deep. A close inspection with TEM analysis of the cross sections reveals the presence of seams indicating a conformal plating. Hence, absence of tartrate copper complex or ethylenediamine copper complex is detrimental for the bottom-up filling on structure with only cobalt liner.

EXAMPLE 8 COMPARATIVE

Trenches with only the cobalt liner as in example 3 were filled. The deposit was realized while using a solution containing copper (II) sulfate and ethylenediamine, no 2,2'-bipyridine, no imidazole, pH being 7.0.

A. Material and Equipment

Substrate:

The substrate used in this example is identical to the one in example 6.

Electrodeoosition Solution:

In this solution, the concentration of CuSO4(H2O)5 was equal to 7.18 mM and the concentration of ethylenediamine was 14.03 mM. The concentration of thiodiglycolic acid could vary from 5 to 200 ppm, for example could be equal to 25 ppm. The pH of the solution was equal to 7.0.

Equipment:

The equipment is strictly identical to the one presented in example 4.

B. Experimental Protocol

The electrical cathodic pulse used here is identical to the one presented in the example 5.

C. Results Obtained

The electrodeposition duration was around 5 minutes to obtain an entire filling of the trenches 21 nm wide and 152 nm deep. A close inspection with TEM analysis of the cross sections reveals the presence of seams indicating a conformal plating. Hence, absence of bipyridine and imidazole copper complex is detrimental for the bottom-up filling on structure with only cobalt liner. The same result was also obtained with a substrate identical to the one used in example 5, that is with a copper seed layer.

EXAMPLE 9 COMPARATIVE

Example 7 comparative has been reproduced with the exception that pH of the electrodeposition solution was 6.8.

The electrodeposition duration was around 12 minutes to obtain an entire filling of the trenches 21 nm wide and 152 nm deep. A close inspection with TEM analysis of the cross sections reveals the presence of seams indicating a conformal plating.

The invention claimed is:

1. An electrolyte having a pH being from 8.5 to 9.5, that is intended for electrodeposition of copper on a metal substrate, said electrolyte comprising, in an aqueous solution, from 0.4 to 50 mM of a mixture of at least two copper (II) ion complexes including:
   a first copper (II) ion complex or combination of complexes selected from the group consisting of:
      a complex of copper (II) ions with 2,2'-bipyridine and imidazole;
      a combination of a complex of copper (II) ions with 2,2'-bipyridine and a complex of copper (II) ions with imidazole;
      a combination of a complex of copper (II) ions with 2,2'-bipyridine and a complex of copper (II) ions with 2,2'-bipyridine and imidazole;
      a combination of a complex of copper (II) ions with imidazole and a complex of copper (II) ions with 2,2'-bipyridine and imidazole; and
      a combination of a complex of copper (II) ions with 2,2'-bipyridine, a complex of copper (II) ions with imidazole, and a complex of copper (II) ions with 2,2'-bipyridine and imidazole; and
   a second copper (II) ion complex that includes a complexing molecule being tartaric acid or ethylenediamine, wherein said complexing molecule is in an acidic or basic form when complexed with the copper,
   wherein the electrolyte is a result of mixing a first solution comprising the first copper (II) ion complex or combination of complexes with a second solution comprising the second copper (II) ion complex,
   said first solution results from mixing copper (II) ions, 2,2'-bipyridine, and imidazole, wherein a molar ratio between a 2,2'-bipyridine concentration and an imidazole concentration is in the range from 4/1 to 1/4, and said second solution results from mixing copper (II) ions with the complexing molecule.

2. The electrolyte as claimed in claim 1, wherein the ratio between the 2,2'-bipyridine concentration and the imidazole concentration is from 1:2 to 2:1.

3. The electrolyte as claimed in claim 1, wherein the molar ratio between the 2,2-bipyridine concentration and a concentration of the complexing molecule is from 1/4 to 4/1.

4. An electrochemical process for copper filling of patterns that are hollowed-out in a dielectric substrate, and have at least one exposed surface of a metal seed layer, wherein said patterns have an opening dimension that is from 5 nm to 45 nm and a form factor that is from 3:1 to 20:1, said process comprising the steps of:
   bringing the exposed surface into contact with an electrolyte, the electrolyte having a pH being from 8.5 to 9.5, that is intended for electrodeposition of copper on a metal substrate, said electrolyte comprising, in an aqueous solution, from 0.4 to 50 mM of a mixture of at least two copper (II) ion complexes including:
      a first copper (II) ion complex or combination of complexes selected from the group consisting of:
         a complex of copper (II) ions with 2,2'-bipyridine and imidazole;
         a combination of a complex of copper (II) ions with 2,2'-bipyridine and a complex of copper (II) ions with imidazole;
         a combination of a complex of copper (II) ions with 2,2'-bipyridine and a complex of copper (II) ions with 2,2'-bipyridine and imidazole;
         a combination of a complex of copper (II) ions with imidazole and a complex of copper (II) ions with 2,2'-bipyridine and imidazole; and
         a combination of a complex of copper (II) ions with 2,2'-bipyridine, a complex of copper (II) ions with imidazole, and a complex of copper (II) ions with 2,2'-bipyridine and imidazole; and
      a second copper (II) ion complex that includes a complexing molecule being tartaric acid or ethylenediamine, wherein said complexing molecule is in an acidic or basic form when complexed with the copper, and
   polarizing the exposed surface with a cathodic electric current and allowing the electrodeposition of copper onto the exposed surface, for a time sufficient to completely fill patterns with a copper deposit that comprises no void.

5. The electrochemical process as claimed in claim 4, wherein the form factor is greater than 4:1.

6. The electrochemical process as claimed in claim 4, further comprising a diffusion barrier layer interposed between the dielectric substrate and the metal seed layer, said diffusion barrier layer comprising at least one material selected from the group consisting of tantalum (Ta), titanium (Ti), tantalum nitride (TaN), titanium nitride (TiN), manganese (Mn) and tungsten (W).

7. The electrochemical process as claimed in claim 4, wherein the cathodic electric current alternates a first intensity being from 0.33 mA/cm$^2$ to 1.67 mA/cm$^2$ at a frequency being between 1 Hz and 4 kHz, and a second intensity being equal to 0 mA/cm$^2$ at a frequency being between 0.5 Hz and 5 kHz.

8. The electrolyte as claimed in claim 1, wherein a concentration of the complexing molecule in the second solution is from 0.15 to 6.0 molar equivalent of a concentration of copper (II) ions in the second solution.

9. The electrolyte as claimed in claim 1, wherein a ratio between a molar concentration of copper (II) ions and a molar concentration resulting from the sum of the imidazole molar concentration and the 2,2'-bipyridine molar concentration is from 1/5 to 10/1 in the first solution.

10. The electrolyte as claimed in claim 1, wherein mixing the first solution and the second solution is performed with a volume ratio between the second solution and the first solution being from 5 vol. % to 35 vol. %.

11. The electrolyte as claimed in claim 1, wherein the pH of the electrolyte is between 9.0 and 9.5.

* * * * *